US006404357B1

United States Patent
Taunton

(10) Patent No.: US 6,404,357 B1
(45) Date of Patent: Jun. 11, 2002

(54) DIGITAL/ANALOGUE COMMUNICATION SYSTEM FOR INCREASING TRANSFER EFFICIENCY OF DIGITAL SAMPLE DATA

(75) Inventor: Mark Taunton, Milton (GB)

(73) Assignee: Element 14, Inc., Cambridge (GB)

( * ) Notice: Subject to any disclaimer, the term of this patent is extended or adjusted under 35 U.S.C. 154(b) by 0 days.

(21) Appl. No.: 09/651,799

(22) Filed: Aug. 30, 2000

(30) Foreign Application Priority Data

Jul. 27, 2000 (GB) .............................. 0018490

(51) Int. Cl.$^7$ ................................................ H03M 7/00
(52) U.S. Cl. .............................. 341/61; 341/50; 341/54; 341/77; 341/143; 341/144; 341/123; 708/313; 708/300; 708/204; 708/422; 375/355; 375/377; 375/212; 375/222; 375/354; 375/247
(58) Field of Search .................................. 341/144, 143, 341/61, 77, 50, 54, 120, 123, 138; 327/105; 375/354, 377, 355, 222, 242; 708/313, 300

(56) References Cited

U.S. PATENT DOCUMENTS

| | | | | |
|---|---|---|---|---|
| 4,184,150 A | * | 1/1980 | Ferrieu et al. ................. 341/61 |
| 4,460,890 A | * | 7/1984 | Busby ........................... 341/61 |
| 5,075,679 A | * | 12/1991 | Gazsi ........................... 341/143 |
| 5,200,750 A | | 4/1993 | Fushiki et al. ............... 341/143 |
| 5,274,372 A | * | 12/1993 | Luthra et al. ................. 341/61 |
| 5,398,029 A | * | 3/1995 | Toyama et al. ............... 341/61 |
| 5,481,267 A | * | 1/1996 | Miyabe et al. ................ 341/61 |
| 5,512,895 A | * | 4/1996 | Madden et al. ............... 341/61 |
| 5,559,513 A | * | 9/1996 | Rothermel et al. ........... 341/61 |
| 5,706,308 A | * | 1/1998 | Ichimura .................... 341/143 |
| 5,729,225 A | * | 3/1998 | Ledzius ........................ 341/61 |
| 5,821,884 A | * | 10/1998 | Lee .............................. 341/61 |
| 5,831,565 A | | 11/1998 | Akune ......................... 341/61 |
| 5,854,599 A | | 12/1998 | Heo et al. ................... 341/143 |
| 5,903,232 A | * | 5/1999 | Zarubinsky ................... 341/61 |
| 6,188,344 B1 | * | 2/2001 | Eastty et al. ................ 341/143 |
| 6,215,423 B1 | * | 4/2001 | May ............................. 341/61 |
| 6,313,765 B1 | * | 11/2001 | Keefer ......................... 341/61 |

FOREIGN PATENT DOCUMENTS

| | | |
|---|---|---|
| EP | 0407031 A3 | 1/1991 |
| EP | 0407031 A2 | 1/1991 |
| EP | 0794621 A2 | 9/1997 |

* cited by examiner

*Primary Examiner*—Patrick Wamsley
*Assistant Examiner*—Lam T. Mai
(74) *Attorney, Agent, or Firm*—Darby & Darby

(57) ABSTRACT

A digital/analogue communication system is described, where data is generated and received by a processing unit in a digital format and transmitted via a communication path in an analogue format. A DSP unit receives a sequence of multi-bit digital samples at a first sampling rate and generates a plurality of interpolated samples. A bit generation unit receives the multi-bit digital samples and the interpolated samples and generates a sequence of single-bit digital samples at a second sampling rate which is higher than the first sampling rate. A set of single wire communication paths are used to convey the single-bit digital samples to respective digital to analogue converters.

The use of single-bit digital samples allows them to be held in a buffer. A buffer controller can be provided to delete single-bit digital samples from the buffer so as to match the sampling times at at least one reference frequency of a received signal with sampling times of a generated signal. This can be used to improve echo cancellation.

10 Claims, 5 Drawing Sheets

DIGITAL/ANALOGUE COMMUNICATION SYSTEM FOR INCREASING TRANSFER EFFICIENCY OF DIGITAL SAMPLE DATA

FIELD OF THE INVENTION

The present invention relates to a digital/analogue communication system, that is one where the data is generated and received by a processing unit in a digital format, but is transmitted via a communication path in an analogue format.

BACKGROUND TO THE INVENTION

In particular, digital subscriber line technology (DSL) is a broadband data transmission technique capable of being implemented on existing and future telecommunications networks. DSL technology can be implemented on telecommunications networks which rely on twisted copper wire pairs to carry signal between a central office and a number of end users and/or within a central office itself. In such telecommunications networks, multiple insulated copper wire pairs are bundled together in a cable binder along portions of their route. Data generated digitally, for example in a modem, is converted into modulated analogue signals for transmission. Conversely, received analogue signals are converted into digital data, for use by the modem.

In such a system, at each end of the transmission line (referred to herein as near end and far end) there is a similar arrangement. This arrangement comprises a processing chip which implements the modem logic or at least receives multibit digital samples from a modem and transmits multibit digital samples to a modem. The processing chip is connected to an analogue front end which contains digital to analogue converters and analogue to digital converters. The analogue front end is connected to the respective twisted wire pairs via a hybrid interface. In existing systems, the processing chip is connected to the analogue front end by a plurality of multibit parallel paths. Each parallel path is responsible for conveying multibit digital samples between the processing chip and the analogue front end. The multibit digital samples are generated at a predetermined sampling period $\Delta t$. The path could be dedicated for a particular communication channel or the samples could be time division multiplexed and spread across a number of paths.

SUMMARY OF THE INVENTION

It is an aim of the invention to increase the efficiency of the transfer of digital sample data between the processing chip and the analogue front end.

According to one aspect of the invention there is provided digital to analogue conversion circuitry for use in a communications system, the circuitry comprising: a digital signal processing unit arranged to receive a sequence of multibit digital samples at a first sampling rate and operable to generate a plurality of interpolated samples by executing a first up-sampling process; a bit generation unit connected to receive said interpolated samples from the digital signal processing unit and arranged to generate therefrom a sequence of single bit digital samples at a second sampling rate higher than said first sampling rate; and a set of single wire communication paths arranged to convey said single bit digital samples for respective channels to respective digital to analogue converters, wherein the digital to analogue converters are operable to produce from the single bit digital samples respective analogue signals for transmission.

It will be appreciated that the first up-sampling process will normally generate a set of interpolated samples based on the timing of the multibit digital samples and intermediate points. However, other interpolation techniques are possible.

Another aspect of the invention provides signal receiving circuitry comprising: a set of single wire communication paths arranged to convey single bit digital samples at a first sampling rate for respective channels; a set of receive buffers associated with said respective channels for receiving said single bit digital samples; a digital signal processing unit connected to said receive buffers and arranged to generate for example, by means of a down-sampling process, from said single bit digital samples multibit digital samples at a second sampling rate lower than said first sampling rate for transmission to modem circuitry; and a buffer controller operable to delete single bit digital samples from the receive buffers so as to match the sampling times for generating multibit digital samples from a received signal with sampling times at which multibit digital samples were generated at a far end transmitter of the signal.

It will be appreciated that complex multi-frequency signals, such as are used in DSL systems, experience frequency-dependent phase-shifts during transmission on real physical lines. The sample-timing match which is obtained will therefore in general be applied with respect to some particular frequency component of a received signal such as a pilot tone or other reference component; it cannot usually be applied with respect to the whole spectrum of the signal.

It is a subsidiary aim of the invention, achieved by some of its embodiments, to improve synchronisation in a communications system.

A further aspect of the invention provides a method of adjusting the delay between a transmitted signal and a modelled echo of said transmitted signal, the method comprising: generating a plurality of multibit digital samples at a first sampling rate representing said transmitted signal; generating from said multibit digital samples a sequence of single bit digital samples at a second sampling rate higher than said first sampling rate and storing said single bit digital samples; detecting the received echo and determining the delay between the transmitted signal and the received echo; and matching the detected delay to the delay between the transmitted signal and the modelled echo by a coarse adjustment step in which the number of multibit digital samples is altered, and a fine adjustment step wherein single bit digital samples are discarded.

This method can be used to generate an accurately timed echo cancellation signal.

Another aspect of the invention provides a method of altering the sampling position for sampling a received analogue signal so as to match the sampling points which were used to generate at least one fixed frequency component of the analogue signal from multibit digital samples at said sampling points, the method comprising: receiving said analogue signal and generating therefrom a sequence of single bit digital samples which are held in a receive buffer; detecting the timings of sampling points at which multibit digital samples used to generate said at least one fixed frequency component of the analogue signal were created; matching the received sampling times to the detected sampling times by discarding single bit digital samples from the receive buffer.

For a better understanding of the present invention and to show how the same may be carried into effect reference will now be made by way of example to the accompanying drawings.

DESCRIPTION OF THE PREFERRED EMBODIMENT

Figure 1:
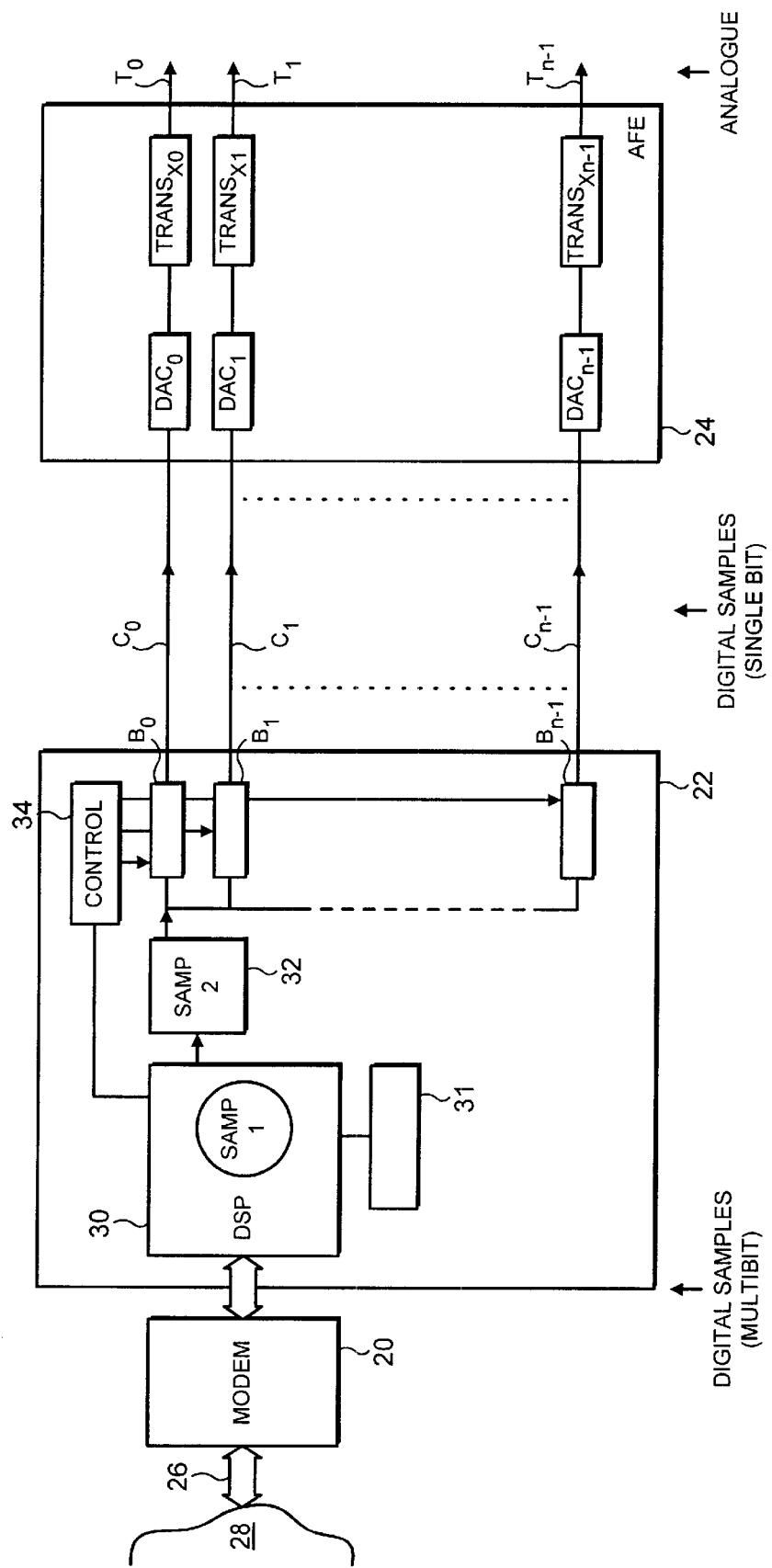
FIG. 1 is a schematic diagram illustrating transmit circuitry.

FIG. 1 is a schematic diagram illustrating an embodiment of the invention. FIG. 1 illustrates a modem 20, a processing chip 22 and an analogue front end 24. FIG. 1 illustrates the situation where a signal is to be transmitted from left to right from a network 28 which supplies digital data via a bus 26 to the modem 20. The modem modulates the digital data and supplies digital samples to the processing chip 22. The modem may in fact be implemented as part of the same chip 22. The digital samples are each in a multibit format. Typically, sixteen bits may be used to represent each digital sample, although only eight bits may be used in a lower quality system. Typical sample sizes are in the range 10–16 bits. The number of bits is not important but it is important to note at this stage that the modem generates a multibit value representing each digital sample. This will be discussed in more detail hereinafter. Typical sampling rates are in the order of 1–2 Msamples/sec. The example described herein has a sampling rate of 2.208 Msamples/sec.

The processing chip 22 receives the multibit digital samples on each of a plurality of channels serviced by the modem 20. Each channel is associated with a dedicated single wire connection C0, C1 ... Cn−1, which connects the processing chip 22 to the analogue front end 24. Each single wire connection C0, C1 ... Cn−1 is connected to a respective digital to analogue converter DAC0, DAC1 ... DACn−1 in the analogue front end. Each digital to analogue converter is connected to a respective transceiver TRANSX0, TRANSX1 ... TRANSXn−1 for driving the analogue signals supplied by the digital to analogue converters onto a respective twisted wire pair T0, T1 ... Tn−1 which is used to convey signals in the analogue domain.

It is important to note that in FIG. 1 there is a single bit dedicated wire connection C0, C1 ... Cn−1 for each channel. This carries single bit digital samples representing the multibit digital samples supplied by the modem 20. These single bit digital samples are generated by the processing chip 22 which will now be described in more detail.

The processing chip 22 comprises a DSP unit 30 which runs an up-sampling program SAMP1. The DSP unit 30 may also in fact implement the function of the modem 20. The output of the DSP unit is supplied to a bit generation unit 32 which is labelled SAMP2 in FIG. 1 to represent the fact that it carries out a second up-sampling stage. However, as will become clear in the following the bit generation unit 32 also carries out a number of other operations to allow a single bit sequence to be generated. Moreover, as will be plain from the following, the up-sampling operation which in the described embodiment is carried out in the bit generation unit 32 could be carried out in the DSP unit, although there are some advantages to splitting the up-sampling process. The processing chip 22 also comprises a plurality of buffers B0, B1 ... Bn−1. These buffers are controlled by a control unit 34. Each buffer can be implemented as a plurality of 64 bit registers, for example. Each buffer holds a sequence of single bit digital samples associated with a particular channel. Their capacity is arranged to suit the particular implementation but they may for example be capable of holding about 2000 single bit samples.

Figure 2A:
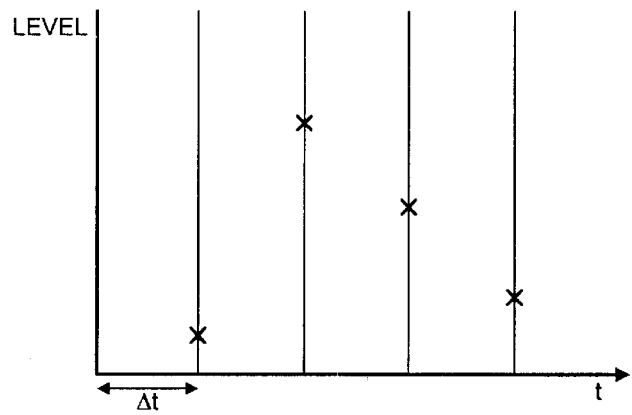
FIGS. 2a to 2c illustrate the effects of oversampling by split sampling processes.
Figure 2B:
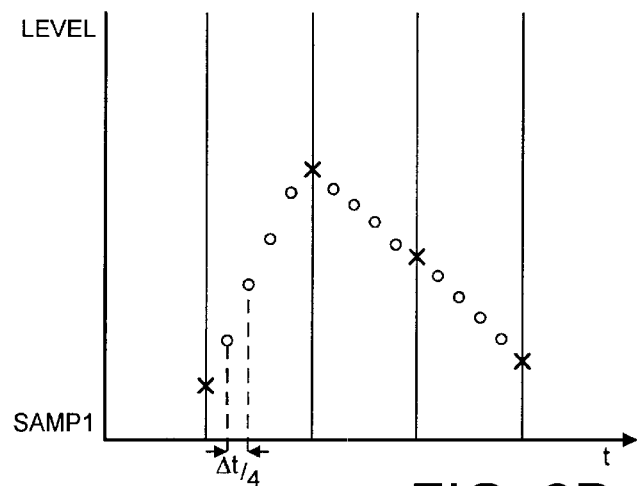
Figure 2C:
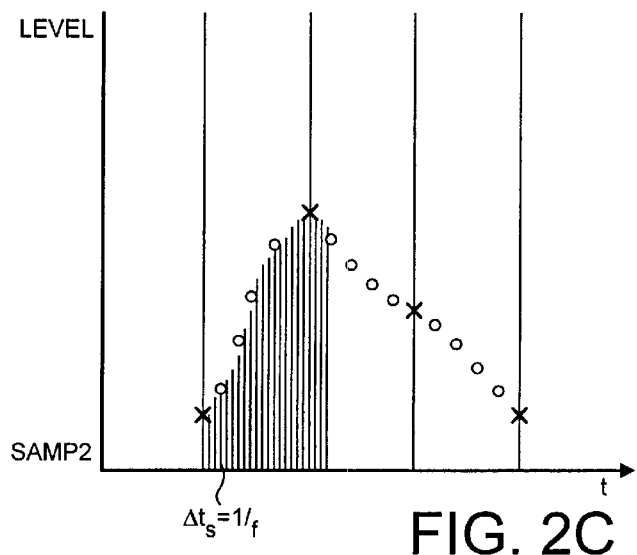

FIGS. 2a to 2c illustrate the effect of the up-sampling operations carried out in the DSP unit 30 (SAMP1) and in the bit generation unit 32 (SAMP2). FIG. 2a illustrates four digital sample levels, each of which will be represented by a multibit value. The samples are taken at a sampling time $\Delta t$ and are marked by an X in FIG. 2a. The up-sampling program SAMP1 run in the DSP unit 30 acts as an up-sampling filter to generate a number of samples between the actual samples indicated by X in FIG. 2A. This can be done according to the best fit algorithm or any other known algorithm. The interpolated values are indicated by "0" in FIG. 2b. They are generated for example at a time interval $\Delta t/4$. Such interpolation programs are known per se. The advantage of running such an up-sampling program in the DSP unit 30 as software is that it can be tailored to a particular application.

Figure 3:
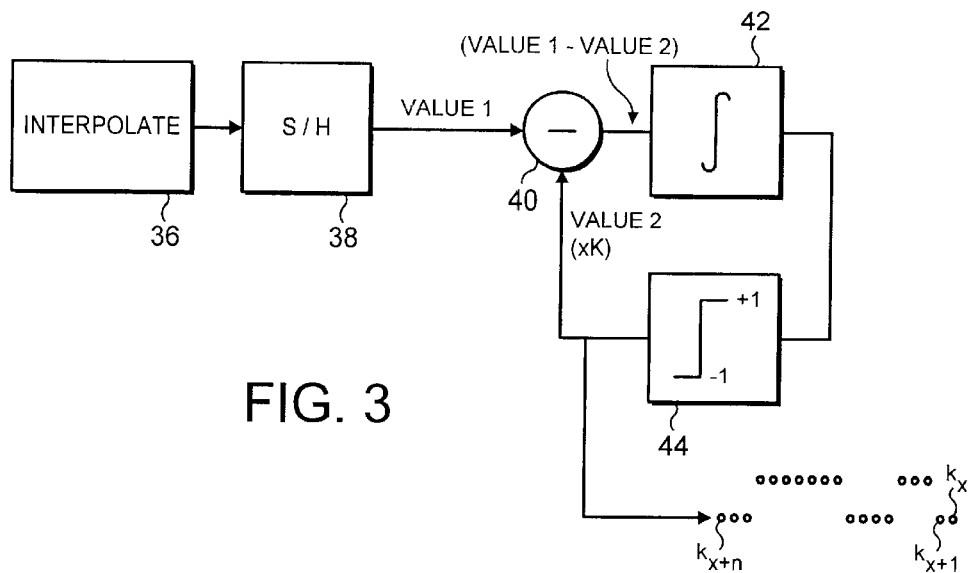
FIG. 3 is a circuit diagram of the bit generation unit.

FIG. 2c illustrates the effect of the up-sampling operation carried out in the bit generation unit 32. As shown in FIG. 3, the bit generation unit 32 contains an interpolation unit 36 which provides interpolated samples which are illustrated by the straight lines in FIG. 2c. This can be done for example using linear interpolation between the actual samples X and the samples 0 generated by the sampling program SAMP1. The interpolated samples are indicated by the vertical black lines in FIG. 2c. The interval $\Delta ts$ between these samples is $1/f$, which is the final sampling frequency and is also the frequency rate at which bits can be transferred across the communication lines C0, C1 ... Cn−1.

FIG. 3 shows the circuitry within the bit generation unit 32. The interpolation unit which carries out the second sample generation process SAMP2 is labelled 36. The output of the interpolation unit 36 is fed to a sample and hold circuit 38. The output of the sample and hold circuit 38 is fed to a difference generator 40 which also receives a feedback signal K generated by an integrator 42 and a 1 bit quantiser 44. The difference generator 40, integrator 42 and quantiser 44 form a digital sigma-delta modulator of a type known per se. The output of the circuit is in the form of a number of generated samples kx, kx+1 ... kx+n which each lie at one of two levels according to the parameters set by the level detector 44. Thus, each of the generated samples kx ... kx+n can be represented by a single bit having a digital value of 0 or 1. Moreover, it will be seen that the rate at which these samples kx ... kx+n is generated is significantly faster than the rate of generation of the original samples X in FIG. 2a due to the interpolating effects of SAMP1 and SAMP2. In fact the modulator operates at the final sample rate which is the basic sample rate (e.g. 2.208 MHz) multiplied by an oversampling factor, which might be, e.g. 32 or 64.

The sigma-delta modulator operates as follows. For each pair of input sample values, one (value1) received from the output of block 38 and the second (value2) received from the quantiser block 44 and multiplied by the integer value K, the difference generator 40 delivers the difference of the two values (i.e. value1−value2) as its output.

The exact design of the integrator unit 42 may vary but in summary it produces an output sample sequence representing the long term average of the sequence of input samples it has previously received. An alternative way to consider it is as a type of digital low-pass filter. High-frequency (short term) variations in its input are diminished, and instead its output reflects the low frequency (long-term) pattern of variation in the input signal.

Block 44 is a simple one bit quantiser: for each input it receives, it outputs merely the sign of that sample, so for +ve (or zero) inputs it will output one value representing +1, and for −ve inputs it will output the alternative value representing −1.

A summary of operation of a sigma-delta modulator such as that just described is that the long-term average value (low frequency part) of the one bit (+1 ,−1) output it generates (as seen at the output of block 44) is the same as the long-term average value (low frequency part) of the input sample train it has received from block 38, when the latter is treated as a sequence of fractional values in the range −1,+1. This is achieved by feeding back the error signal (difference between the input and output, i.e. negative feedback) so as to cancel out the error, when viewed over the long term (i.e. via the integrator block 42 which emphasises the long-term characteristic and de-emphasises the short-term variations).

Reverting to FIG. 1, the samples kx, kx+1 . . . kx+n are held in the buffer B0 . . . Bn−1 appropriate to the particular channel for which the samples have been generated. These samples are then conveyed along the communication line C0 . . . Cn−1 under the control of a control unit 34. The digital to analogue converters DAC0, DAC1 . . . DACn−1 in the analogue front end 24 are simply 1-bit converters, converting the train of digital bits (1s and 0s) representing either +1 or −1 values, into corresponding analogue levels, and by means of an analogue low-pass filter producing a smooth continuous analogue output signal.

Figure 4:
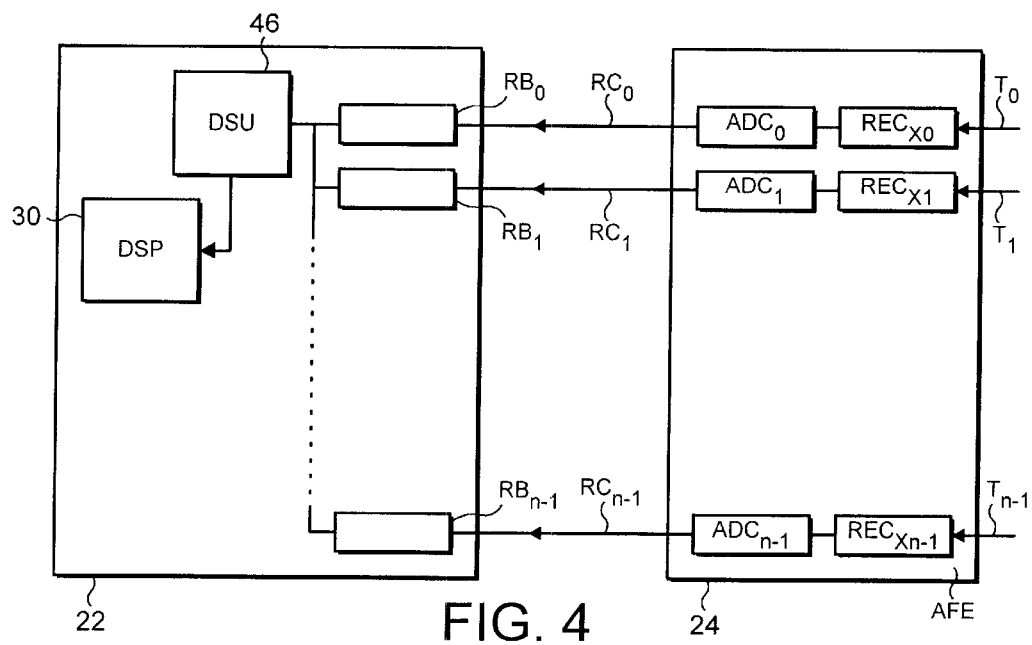
FIG. 4 is a schematic diagram of receive circuitry.

FIG. 4 illustrates the circuitry on the receive side. It will be appreciated that this circuitry is implemented in the processing chip 22 and analogue front end 24 already illustrated in FIG. 1. For reasons of clarity however, the receive side will now be described separately. The analogue front end comprises a plurality of line receivers RECX0, RECX1 . . . RECXn−1 which receive analogue signals along the twisted wire pairs T0, T1 . . . Tn−1. Each line receiver is connected to an analogue to digital converter ADC0, ADC1 . . . ADCn−1 which is of the sigma-delta type and which generates a set of single bit digital samples from an incoming analogue signal. That is, the samples are of the type kx, kx+1 . . . kx+10 discussed above with reference to FIG. 3. These samples are held in respective receive buffers RB0, RB1 . . . RBn−1 in the sampling circuit. These buffers are of the same type and have a similar capacity to the transmit buffers B0, B1 . . . Bn−1 already discussed above with reference to FIG. 1. The high rate stream of single bit samples is transmitted from the analogue front end 24 to the processing chip 22 by way of dedicated single wire communication lines RC0, RC1 . . . RCn−1. A digital sampling unit receives the single bit digital samples from the receive buffers and converts them into multibit digital samples which can be processed by the DSP unit 30.

There are a number of possible methods of achieving this, but typically a DSU unit 46 applies a severe low-pass filter (typically a FIR filter with many taps) to the incoming sample train, so as to substantially reduce the high-frequency energy in the (one bit) signal. This leaves mostly just low-frequency variations in it (i.e. variations at frequencies below half of the output sample rate). The down-converter then takes only every Nth value of the output of the filter as the down-sampled output sample sequence, where N is the down-sampling ratio and matches the over-sampling factor (e.g. 32 or 64).

The process of applying a long FIR filter, especially at very high frequency, is greatly simplified by the use of single bit values, because the multiplications are very simple—every input value represents either +1 or −1 so no real multiplication is required, just a switch of the sign of the filter coefficient as implied by each input sample, before a final summation of the sign-adjusted products.

Furthermore, because only every Nth output of the filter is actually used, it is possible to omit the calculation of all the N−1 intermediate filter output values, since the output of an FIR filter depends only on the current and past inputs and not on past outputs. This further reduces the amount of work required, by a factor N.

A final easing of the processing load arises because often the upstream bandwidth (incoming to the modem in the central office (near end)) is lower than the downstream bandwidth (outgoing from the central office), and so a sampling rate for the input analogue to digital converter (ADC) lower than that required for the output digital to analogue converter (DAC) may be used. So, for example, a full rate ADSL modem (at the central office) may generate basic rate samples at 2.208 Msamples/sec because the transmitted bandwidth extends up to 1.104 MHz, but its receiver can in principle operate with basic rate samples at only 0.552 Msamples/sec because the modem in the customer premises (far end) transmits a signal with a bandwidth of only 0.276 MHz at most. Thus the one bit sigma-delta analogue to digital converter in the AFE 24 can be run at a lower rate (say, 32*0.552=17.664 million one bit sample/sec.

For all these reasons, it may be possible to perform the downsampling process on the DSP 30 itself in software and dispense with a separate DSU unit 46 as illustrated. However, in some cases at least part of the downsampling may well still be done in hardware via such a unit.

A number of advantages arise from the above described approach. The number of wires required to connect the processing chip 32 to the analogue front end 24 is significantly reduced in comparison with what is required to transmit multibit digital signal levels on each channel. Moreover, the construction of the digital to analogue converters is simplified. This is because they are only required to convert between digital samples at two levels and an analogue signal.

Another advantage results from the oversampling which has taken place to generate the single bit digital samples held in the transmit and receive buffers B0, RB0 etc. The sampling time on each channel at the transmit and receive ends may become out of synchronisation for a number of reasons. It is possible to fine tune the sampling time by discarding a requisite number of samples from the receive buffer RB0 on the channel so as to bring the transmit and receive sampling times back into synchronisation. Thus the use of a multibit stream of single bit digital samples allows the sampling time to be finely tuned within a "normal" sampling period (Δt in FIG. 2a) by discarding samples from the buffer to adjust the timing on a per channel basis.

Figure 5A:
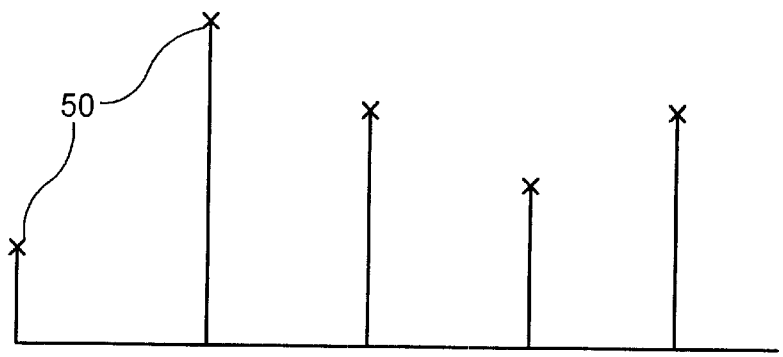
FIGS. 5a and 5b illustrate the alteration of timing between the generation of digital samples for transmission of an analogue signal and the sampling times of the received analogue signals.
Figure 5B:
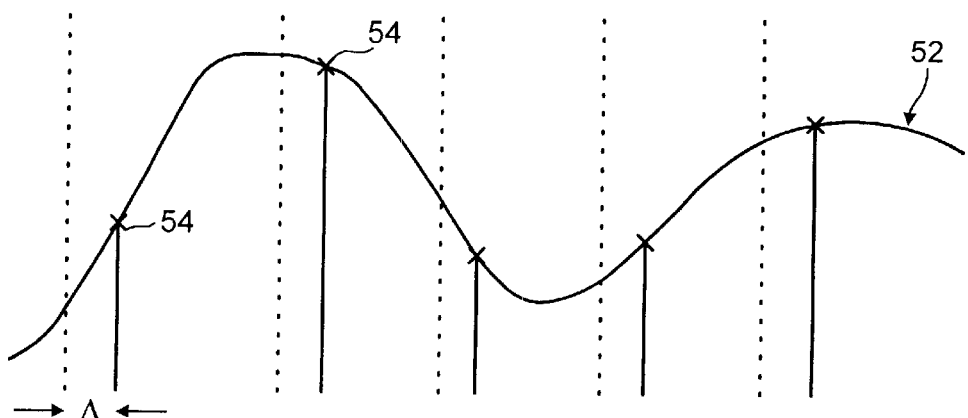

That is, fine-tuning the timing by "slipping" some number of single bit samples allows the system to find the best point (viewed as an offset within the basic sample period) at which to sample a continuous analogue waveform (denoted 52 in FIG. 5b). Because that waveform was created by a transmitter at the other end of the wire, and that transmitter created the continuous waveform by starting with a train of discrete digital samples (denoted 50 in FIG. 5a) and effectively interpolating between them, there will be some point in time within each sample period which gets "closest" to matching the sample points in time that the far-end transmitter started from, at least with respect to some particular reference frequency or frequencies. Reference numeral 54 denotes the actual samples at the receive side prior to adjustment. There is a time difference Δ from the signal sampling points. Ideally we would like to sample the waveform at exactly the same points on it which correspond to the timing of the original discrete sample values. In fact, because signal delay and signal attenuation typically vary in a frequency-dependent manner in the course of transmission over any real line, the shape of the analogue signal waveform received will in general have been distorted from the original transmission. Thus there is no single sampling position which trivially recreates the original sample sequence exactly. However the delay for individual frequencies present in the signal will be broadly constant (or only very slowly varying) for a given line. In particular there is usually a designated pilot frequency, or other reference frequency, which the modem can use as a basis for reconstructing the information in the signal as a whole. It is therefore advantageous to sample the signal such that when that reference frequency component alone is considered (with the particularly delay Δ which it experiences in transmission), the sampling points at the receiver match as closely as possible to the equivalent sampling points at the transmitter. By oversampling by large factors (e.g. 32 or 64) (and thus generating a large number of single bit samples) we have available a relatively fine adjustment within the basic sample period (to $\frac{1}{32}^{nd}$ or $\frac{1}{64}^{th}$ of a sample time), so as to improve the accuracy with which we can approximate that ideal sampling point. That is the number of samples corresponding to the difference Δ can be discarded.

Figure 6A:
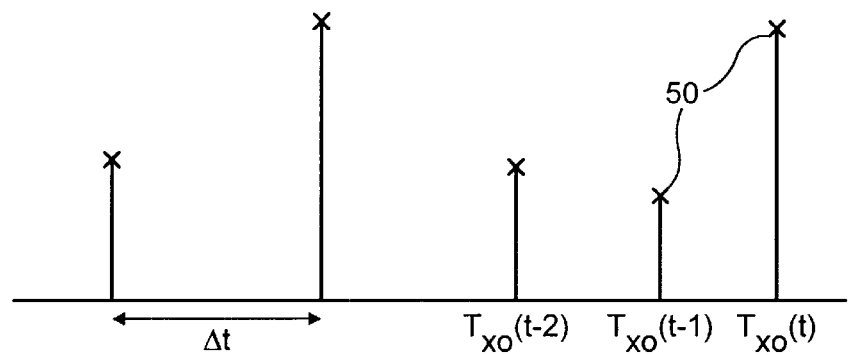
FIGS. 6a and 6b illustrate the alteration of timing between a transmitted signal and its received echo.
Figure 7:
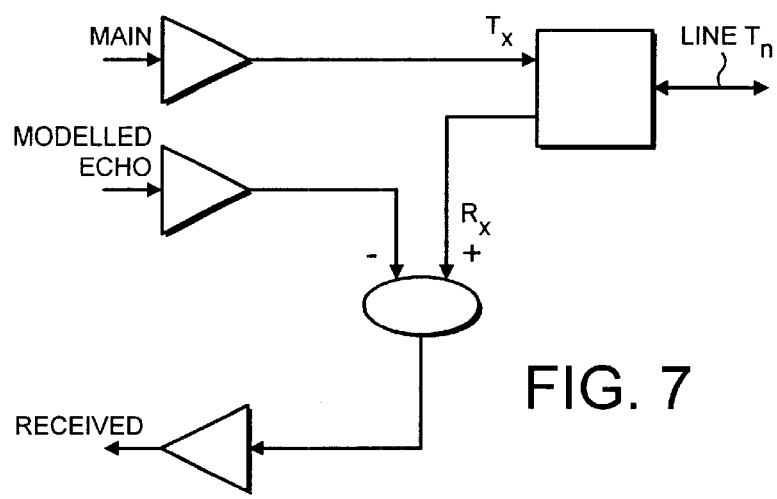
FIG. 7 is a diagram illustrating echo cancellation.

A similar concept can also be used on the transmission side. This can be useful for example when an echo cancelling signal (the modelled echo) is generated for the cancellation of "echos" which can occur when a signal (MAIN) is transmitted on a twisted wire pair $T_n$ (see FIG. 7). The line characterisation can be such that the signal is effectively reflected back so that it appears as a component in received signal Rx on the transmit side. This received echo can interfere with other incoming signals, making demodulation and decoding difficult. It is known therefore to generate an echo cancellation signal MODELLED ECHO using the transmitted signal data and the line characteristics which are characterised by echo coefficients, e, at certain delays τ. The echo cancellation signal is generated in the DSP unit using the multibit digital samples 50 identifying the transmitted signal. These samples 50 are labelled in FIG. 6a according to their timing –Txo(t) represents the current transmitted value on channel #0; Txo(t–1) represents the next transmitted value on channel #0, etc. to Txo(t–p) where p represents the number of samples that are stored at the DSP unit in an echo sample buffer store 31 for use in echo cancellation, typically 20–200.

The echo cancellation signal is then generated as:

$$\Sigma = Txo(t)*e(t) + Txo(t-1)*e(t-1) + \ldots Txo(t-p)*e(t-p)$$

The echo cancellation coefficients e(t), e(t–1) etc. represent the ratio of the transmitted signal power to received signal power at the peak of an echo impulse response generated by the correlation of a test transmitted signal with the received signal.

Figure 6B:
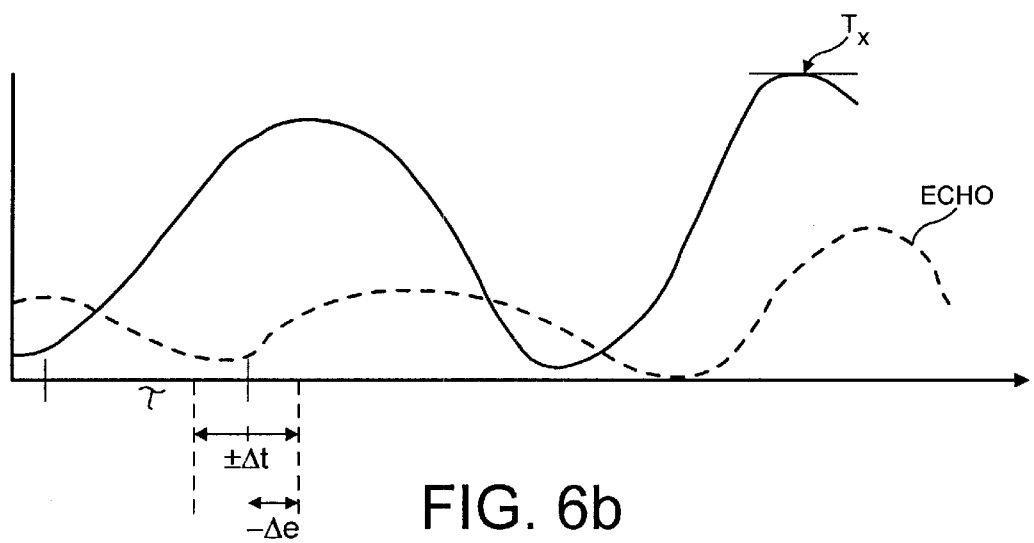

In this arrangement it is clearly valuable to adjust the timing of the echo cancellation signal when it is used to cancel the echo of a live transmitted signal so that the effective delay between the transmitted signal and the echo cancellation signal closely matches the real echo time delay τ (or, at least, the delay to the peak of the echo impulse response). See FIG. 6b.

Coarse adjustment of the delay τ can be effected by adding or discarding samples $T_{xn}$ in the echo sample buffer 31 at the original sampling rate Δt. A finer adjustment is possible by "slipping" one or a few single bit samples from the transmit buffer $B_n$ associated with the particular channel. This is shown diagrammatically by $\Delta_e$ in FIG. 6b where $\Delta_e$ represents the delay of a required number of single bit samples.

The calculation of the echo impulse response, and generation of an echo cancellation signal, and coarse adjustment is carried out by the DSP unit 30 in a known manner. The DSP unit advises the control unit 34 of the number of single bit samples to "slip" for the finer adjustment according to an embodiment of this invention.

What is claimed is:

1. Digital to analogue conversion circuitry for use in a communications system, the circuitry comprising:

a digital signal processing unit arranged to receive a sequence of multibit digital samples at a first sampling rate and operable to generate a plurality of interpolated samples by executing a first up-sampling process;

a bit generation unit connected to receive said multibit digital samples and said interpolated samples from the digital signal processing unit and arranged to generate therefrom a sequence of single bit digital samples at a second sampling rate higher than said first sampling rate; and a set of single wire communication paths arranged to convey said single bit digital samples for respective channels to respective digital to analogue converters, wherein the digital to analogue converters are operable to produce from the single bit digital samples respective analogue signals for transmission.

2. Conversion circuitry according to claim 1, wherein each bit generation unit is a digital sigma-delta converter.

3. Conversion circuitry according to claim 1, wherein the digital signal processing unit is operable to execute a filtering algorithm to generate said plurality of interpolated samples.

4. Conversion circuitry according to claim 1, wherein the bit generation unit includes an interpolation unit which is arranged to generate a plurality of further samples between said multibit digital samples and said interpolated samples.

5. Conversion circuitry according to claim 4, wherein the bit generation unit comprises a sample and hold circuit arranged to receive said interpolated samples and said further samples whereby to generate sampled levels from which said single bit digital samples are generated.

6. Conversion circuitry according to claim 1, wherein each communication path is associated with a respective transmit buffer for holding a plurality of said single bit digital samples.

7. Conversion circuitry according to claim 6, which comprises a buffer control unit operable to delete single bit samples from said transmit buffers thereby to allow timing of transmitted signals to be controlled.

8. Signal receiving circuitry comprising:

a set of single wire communication paths arranged to convey single bit digital samples at a first sampling rate for respective channels;

a set of receive buffers associated with said respective channels for receiving said single bit digital samples;

a digital signal processing unit connected to said receive buffers and arranged to generate from said single bit digital samples multibit digital samples at a second sampling rate lower than said first sampling rate for transmission to modem circuitry; and a buffer controller operable to delete single bit digital samples from the receive buffers so as to match with respect to at least one reference frequency component of a received signal the sampling times for generating multibit digital samples from a received signal with sampling times at which multibit digital samples were generated at a far end transmitter of the signal.

9. A method of adjusting the delay between a transmitted signal and a modelled echo of said transmitted signal, the method comprising:

generating a plurality of multibit digital samples at a first sampling rate representing said transmitted signal;

generating from said multibit digital samples a sequence of single bit digital samples at a second sampling rate higher than said first sampling rate and storing said single bit digital samples;

detecting the received echo and determining the delay between the transmitted signal and the received echo; and matching the detected delay to the delay between the transmitted signal and the modelled echo by a coarse adjustment step in which the number of multibit digital samples is altered, and a fine adjustment step wherein single bit digital samples are discarded.

10. A method of altering the sampling period for sampling a received analogue signal so as to match with respect to at least one reference frequency component of said received analogue signal the sampling points which were used to generate the analogue signal from multibit digital samples at said sampling points, the method comprising:

receiving said analogue signal and generating therefrom a sequence of single bit digital samples which are held in a receive buffer;

detecting the timings of sampling points at which multibit digital samples used to generate the analogue signal were created;

matching the received sampling times to the detected sampling times by discarding single bit digital samples from the receive buffer.

* * * * *